US008316536B1

(12) United States Patent
Huemoeller et al.

(10) Patent No.: US 8,316,536 B1
(45) Date of Patent: Nov. 27, 2012

(54) MULTI-LEVEL CIRCUIT SUBSTRATE FABRICATION METHOD

(75) Inventors: Ronald Patrick Huemoeller, Chandler, AZ (US); David Jon Hiner, Chandler, AZ (US); Russ Lie, Phoenix, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 1237 days.

(21) Appl. No.: 12/151,857

(22) Filed: May 9, 2008

Related U.S. Application Data

(63) Continuation of application No. 11/045,402, filed on Jan. 28, 2005, now abandoned, which is a continuation-in-part of application No. 10/138,225, filed on May 1, 2002, now Pat. No. 6,930,256.

(51) Int. Cl.
*H01K 3/10* (2006.01)
(52) U.S. Cl. .......... 29/853; 29/830; 29/852; 174/262
(58) Field of Classification Search .......... 29/825, 29/846, 852, 830, 853; 174/262
See application file for complete search history.

(56) References Cited

U.S. PATENT DOCUMENTS

| | | | |
|---|---|---|---|
| 3,324,014 A | 6/1967 | Modjeska | 205/122 |
| 3,778,900 A | 12/1973 | Haining et al. | 29/628 |
| 3,868,724 A | 2/1975 | Perrino | 357/65 |
| 3,916,434 A | 10/1975 | Garboushian | 357/74 |
| 4,322,778 A | 3/1982 | Barbour et al. | 361/414 |
| 4,508,754 A | 4/1985 | Stepan | 427/53.1 |
| 4,532,152 A | 7/1985 | Elarde | 427/96 |
| 4,532,419 A | 7/1985 | Takeda | 235/492 |
| 4,604,799 A * | 8/1986 | Gurol | 29/847 |
| 4,642,160 A | 2/1987 | Burgess | 156/630 |
| 4,685,033 A | 8/1987 | Inoue | 361/414 |
| 4,706,167 A | 11/1987 | Sullivan | 361/406 |
| 4,716,049 A | 12/1987 | Patraw | 427/96 |
| 4,786,952 A | 11/1988 | MacIver et al. | 357/23.4 |
| 4,806,188 A | 2/1989 | Rellick | 156/89 |
| 4,811,082 A | 3/1989 | Jacobs et al. | 357/80 |
| 4,897,338 A | 1/1990 | Spicciati et al. | 430/314 |
| 4,905,124 A | 2/1990 | Banjo et al. | 361/395 |
| 4,915,983 A | 4/1990 | Lake et al. | 430/314 |
| 4,964,212 A | 10/1990 | Deroux-Dauphin et al. | 29/852 |
| 4,974,120 A | 11/1990 | Kodai et al. | 361/392 |

(Continued)

FOREIGN PATENT DOCUMENTS
JP    05-109975    4/1993
(Continued)

OTHER PUBLICATIONS

Berry et al., "Thin Stacked Interposer Package", U.S. Appl. No. 11/865,617, filed Oct. 1, 2007.

(Continued)

*Primary Examiner* — Carl Arbes
(74) *Attorney, Agent, or Firm* — McKay and Hodgson, LLP; Serge J. Hodgson

(57) ABSTRACT

A method of making a semiconductor package substrate includes laser-ablating channels in the substrate. After the channels are ablated in the substrate, conductive material is added to fill the channels and cover the surface of the substrate. Then a photomask etching process simultaneously forms a circuit pattern above the surface of the substrate and removes excess metal above the channels, by removing metal above the surface only in patterned regions. The result is a two-level circuit pattern having conductors within and above the substrate.

20 Claims, 5 Drawing Sheets

U.S. PATENT DOCUMENTS

| | | | | |
|---|---|---|---|---|
| 4,996,391 A | 2/1991 | Schmidt | | 174/255 |
| 5,021,047 A | 6/1991 | Movern | | 604/110 |
| 5,053,357 A | 10/1991 | Lin et al. | | 437/204 |
| 5,072,075 A | 12/1991 | Lee et al. | | 174/264 |
| 5,081,520 A | 1/1992 | Yoshii et al. | | 357/80 |
| 5,108,553 A | 4/1992 | Foster et al. | | 205/125 |
| 5,110,664 A | 5/1992 | Nakanishi et al. | | 428/195 |
| 5,191,174 A | 3/1993 | Chang et al. | | 174/266 |
| 5,229,550 A | 7/1993 | Bindra et al. | | 174/262 |
| 5,239,448 A | 8/1993 | Perkins et al. | | 361/764 |
| 5,247,429 A | 9/1993 | Iwase et al. | | 362/29 |
| 5,263,243 A | 11/1993 | Taneda et al. | | 29/830 |
| 5,283,459 A | 2/1994 | Hirano et al. | | 257/419 |
| 5,293,243 A | 3/1994 | Degnan et al. | | |
| 5,371,654 A | 12/1994 | Beaman et al. | | 361/744 |
| 5,379,191 A | 1/1995 | Carey et al. | | 361/777 |
| 5,404,044 A | 4/1995 | Booth et al. | | 257/698 |
| 5,440,805 A | 8/1995 | Daigle et al. | | 29/830 |
| 5,463,253 A | 10/1995 | Waki et al. | | 257/724 |
| 5,474,957 A | 12/1995 | Urushima | | 437/209 |
| 5,474,958 A | 12/1995 | Djennas et al. | | 437/211 |
| 5,508,938 A | 4/1996 | Wheeler | | 364/488 |
| 5,530,288 A | 6/1996 | Stone | | 257/700 |
| 5,531,020 A | 7/1996 | Durand et al. | | 29/840 |
| 5,574,309 A | 11/1996 | Papapietro et al. | | 257/679 |
| 5,581,498 A | 12/1996 | Ludwig et al. | | 365/63 |
| 5,582,858 A | 12/1996 | Adamopoulos et al. | | 427/96 |
| 5,616,422 A | 4/1997 | Ballard et al. | | 428/621 |
| 5,637,832 A | 6/1997 | Danner | | 174/260 |
| 5,674,785 A | 10/1997 | Akram et al. | | 437/217 |
| 5,719,749 A | 2/1998 | Stopperan | | 361/769 |
| 5,739,579 A | 4/1998 | Chiang et al. | | 257/635 |
| 5,739,581 A | 4/1998 | Chillara | | 257/668 |
| 5,739,585 A | 4/1998 | Akram et al. | | 257/698 |
| 5,739,588 A | 4/1998 | Ishida et al. | | 257/782 |
| 5,742,479 A | 4/1998 | Asakura | | 361/737 |
| 5,774,340 A | 6/1998 | Chang et al. | | 361/771 |
| 5,784,259 A | 7/1998 | Asakura | | 361/752 |
| 5,798,014 A | 8/1998 | Weber | | 156/263 |
| 5,822,190 A | 10/1998 | Iwasaki | | 361/737 |
| 5,826,330 A | 10/1998 | Isoda et al. | | 29/852 |
| 5,835,355 A | 11/1998 | Dordi | | 361/760 |
| 5,847,453 A | 12/1998 | Uematsu et al. | | 257/728 |
| 5,894,108 A | 4/1999 | Mostafazadeh et al. | | 174/52.4 |
| 5,903,052 A | 5/1999 | Chen et al. | | 257/706 |
| 5,936,843 A | 8/1999 | Ohshima et al. | | 361/760 |
| 5,952,611 A | 9/1999 | Eng et al. | | 174/52.4 |
| 5,990,546 A | 11/1999 | Igarashi et al. | | 257/700 |
| 6,004,619 A | 12/1999 | Dippon et al. | | 427/97 |
| 6,013,948 A | 1/2000 | Akram et al. | | 257/698 |
| 6,021,564 A | 2/2000 | Hanson | | 29/852 |
| 6,028,364 A | 2/2000 | Ogino et al. | | 257/778 |
| 6,034,427 A | 3/2000 | Lan et al. | | 257/698 |
| 6,035,527 A | 3/2000 | Tamm | | |
| 6,039,889 A | 3/2000 | Zhang et al. | | |
| 6,040,622 A | 3/2000 | Wallace | | 257/679 |
| 6,060,778 A | 5/2000 | Jeong et al. | | 257/710 |
| 6,069,407 A | 5/2000 | Hamzehdoost | | 257/774 |
| 6,072,243 A | 6/2000 | Nakanishi | | 257/698 |
| 6,081,036 A | 6/2000 | Hirano et al. | | 257/773 |
| 6,115,910 A | 9/2000 | Ghahghahi | | 29/833 |
| 6,119,338 A | 9/2000 | Wang et al. | | 29/852 |
| 6,122,171 A | 9/2000 | Akram et al. | | 361/704 |
| 6,127,250 A | 10/2000 | Sylvester et al. | | 438/584 |
| 6,127,833 A | 10/2000 | Wu et al. | | 324/755 |
| 6,160,705 A | 12/2000 | Stearns et al. | | 361/704 |
| 6,162,365 A | 12/2000 | Bhatt et al. | | 216/13 |
| 6,172,419 B1 | 1/2001 | Kinsman | | 257/737 |
| 6,175,087 B1 | 1/2001 | Keesler et al. | | 174/261 |
| 6,184,463 B1 | 2/2001 | Panchou et al. | | 174/52.4 |
| 6,194,250 B1 | 2/2001 | Melton et al. | | |
| 6,204,453 B1 | 3/2001 | Fallon et al. | | 174/255 |
| 6,214,641 B1 | 4/2001 | Akram | | 438/107 |
| 6,235,554 B1 | 5/2001 | Akram et al. | | 438/109 |
| 6,239,485 B1 | 5/2001 | Peters et al. | | 257/700 |
| D445,096 S | 7/2001 | Wallace | | D14/117 |
| D446,525 S | 8/2001 | Okamoto et al. | | D14/436 |
| 6,274,821 B1 | 8/2001 | Echigo et al. | | 174/255 |
| 6,280,641 B1 | 8/2001 | Gaku et al. | | 216/17 |
| 6,316,285 B1 | 11/2001 | Jiang et al. | | 438/106 |
| 6,351,031 B1 | 2/2002 | Iijima et al. | | 257/698 |
| 6,352,914 B2 | 3/2002 | Ball et al. | | 438/599 |
| 6,353,999 B1 | 3/2002 | Cheng | | 29/852 |
| 6,365,975 B1 | 4/2002 | DiStefano et al. | | 257/777 |
| 6,368,967 B1 | 4/2002 | Besser | | 438/687 |
| 6,376,906 B1 | 4/2002 | Asai et al. | | 257/698 |
| 6,378,201 B1 * | 4/2002 | Tsukada et al. | | 29/852 |
| 6,392,160 B1 | 5/2002 | Andry et al. | | 174/261 |
| 6,395,578 B1 | 5/2002 | Shin et al. | | 438/106 |
| 6,405,431 B1 | 6/2002 | Shin et al. | | 29/852 |
| 6,406,942 B2 | 6/2002 | Honda | | 438/119 |
| 6,407,341 B1 | 6/2002 | Anstrom et al. | | 174/255 |
| 6,407,930 B1 | 6/2002 | Hsu | | 361/784 |
| 6,418,615 B1 | 7/2002 | Rokugawa et al. | | 29/852 |
| 6,426,550 B2 | 7/2002 | Ball et al. | | 257/700 |
| 6,451,509 B2 | 9/2002 | Keesler et al. | | 430/311 |
| 6,472,306 B1 | 10/2002 | Lee et al. | | 438/623 |
| 6,479,762 B2 | 11/2002 | Kusaka | | 174/261 |
| 6,497,943 B1 | 12/2002 | Jimarez et al. | | 428/209 |
| 6,502,774 B1 | 1/2003 | Johansson et al. | | 241/37 |
| 6,517,995 B1 | 2/2003 | Jacobson et al. | | 430/320 |
| 6,528,874 B1 | 3/2003 | Iijima et al. | | |
| 6,534,391 B1 | 3/2003 | Huemoeller et al. | | 438/612 |
| 6,534,723 B1 | 3/2003 | Asai et al. | | 174/255 |
| 6,544,638 B2 | 4/2003 | Fischer et al. | | 428/322.7 |
| 6,570,258 B2 | 5/2003 | Ma et al. | | 257/774 |
| 6,574,106 B2 | 6/2003 | Mori | | 361/705 |
| 6,586,682 B2 | 7/2003 | Strandberg | | 174/255 |
| 6,608,757 B1 | 8/2003 | Bhatt et al. | | 361/748 |
| 6,637,105 B1 | 10/2003 | Watanabe et al. | | 29/852 |
| 6,660,559 B1 | 12/2003 | Huemoeller et al. | | 438/106 |
| 6,715,204 B1 | 4/2004 | Tsukada et al. | | 29/847 |
| 6,727,645 B2 | 4/2004 | Tsujimura et al. | | 313/504 |
| 6,730,857 B2 | 5/2004 | Konrad et al. | | 174/257 |
| 6,740,964 B2 | 5/2004 | Sasaki | | |
| 6,753,612 B2 | 6/2004 | Adae-Amoakoh et al. | | 257/774 |
| 6,787,443 B1 | 9/2004 | Boggs et al. | | 438/612 |
| 6,803,528 B1 | 10/2004 | Koyanagi | | 174/262 |
| 6,804,881 B1 | 10/2004 | Shipley et al. | | 29/830 |
| 6,815,709 B2 | 11/2004 | Clothier et al. | | 257/40 |
| 6,815,739 B2 | 11/2004 | Huff et al. | | 257/275 |
| 6,822,334 B2 | 11/2004 | Hori et al. | | 257/775 |
| 6,891,261 B2 | 5/2005 | Awaya | | 257/692 |
| 6,908,863 B2 | 6/2005 | Barns et al. | | |
| 6,913,952 B2 | 7/2005 | Moxham et al. | | 438/125 |
| 6,919,514 B2 | 7/2005 | Konrad et al. | | |
| 6,930,256 B1 * | 8/2005 | Huemoeller et al. | | 174/260 |
| 6,930,257 B1 | 8/2005 | Hiner et al. | | 174/262 |
| 6,940,170 B2 | 9/2005 | Parikh | | 257/750 |
| 6,989,593 B2 | 1/2006 | Khan et al. | | 257/707 |
| 6,998,335 B2 | 2/2006 | Fan et al. | | 438/612 |
| 7,028,400 B1 | 4/2006 | Hiner et al. | | 29/852 |
| 7,033,928 B2 | 4/2006 | Kawano | | 438/637 |
| 7,061,095 B2 | 6/2006 | Boggs et al. | | |
| 7,145,238 B1 | 12/2006 | Huemoeller et al. | | 257/750 |
| 7,214,609 B2 | 5/2007 | Jiang et al. | | 438/637 |
| 7,242,081 B1 | 7/2007 | Lee | | |
| 7,292,056 B2 | 11/2007 | Matsuda | | |
| 7,297,562 B1 | 11/2007 | Huemoeller et al. | | 438/15 |
| 7,345,361 B2 | 3/2008 | Mallik et al. | | |
| 7,365,006 B1 | 4/2008 | Huemoeller et al. | | 438/637 |
| 7,372,151 B1 | 5/2008 | Fan et al. | | |
| 7,435,352 B2 | 10/2008 | Mok et al. | | |
| 7,752,752 B1 * | 7/2010 | Rusli et al. | | 29/853 |
| 2001/0044436 A1 | 11/2001 | Parikh | | |
| 2002/0017712 A1 | 2/2002 | Bessho et al. | | 257/700 |
| 2002/0140105 A1 | 10/2002 | Higgins, III et al. | | |
| 2003/0000738 A1 | 1/2003 | Rumsey et al. | | 174/260 |
| 2003/0128096 A1 | 7/2003 | Mazzochette | | 338/22 |
| 2005/0194353 A1 | 9/2005 | Johnson et al. | | 216/65 |
| 2005/0205295 A1 | 9/2005 | Tsuk | | |
| 2006/0157854 A1 | 7/2006 | Takewaki et al. | | |
| 2006/0197228 A1 | 9/2006 | Daubenspeck et al. | | |
| 2007/0114203 A1 | 5/2007 | Kang | | |
| 2007/0273049 A1 | 11/2007 | Khan et al. | | |
| 2007/0290376 A1 | 12/2007 | Zhao et al. | | |
| 2008/0230887 A1 | 9/2008 | Sun et al. | | |

FOREIGN PATENT DOCUMENTS

| | | |
|---|---|---|
| JP | 05-136323 | 6/1993 |
| JP | 07-017175 | 1/1995 |
| JP | 08-190615 | 7/1996 |
| JP | 10-334205 | 12/1998 |

OTHER PUBLICATIONS

Scanlan, "Package-on-package (PoP) with Through-mold Vias", *Advanced Packaging*, Jan. 2008, 3 pages, vol. 17, Issue 1, PennWell Corporation.

Kim et al., "Application of Through Mold Via (TMV) as PoP base package", *58th ECTC Proceedings*, May 2008, Lake Buena Vista, FL, 6 pages, IEEE.

Huemoeller et al., "Method and Structure for Creating Embedded Metal Features", U.S. Appl. No. 12/462,665, filed Aug. 5, 2009.

Huemoeller et al., "Semiconductor Package Substrate Having a Printed Circuit Pattern Atop and Within a Dielectric and Method for Making a Substrate", U.S. Appl. No. 11/045,402, filed Jan. 28, 2005.

Huemoeller et al., "Semiconductor Package Having Laser-Embedded Terminals", U.S. Appl. No. 11/182,985, filed Jul. 14, 2005.

Huemoeller et al., "Integral Plated Semiconductor Package Substrate Stiffener", U.S. Appl. No. 11/189,593, filed Jul. 26, 2005.

Hiner et al., "Extended Landing Pad Substrate Package Structure and Method", U.S. Appl. No. 12/351,596, filed Jan. 9, 2009.

IBM Technical Disclosure Bulletin, "Microstructure Solder Mask by Means of a Laser", vol. 36, Issue 11, p. 589, Nov. 1, 1993. (NN9311589).

Wolf et al., "Silicon Processing for the VLSI Era: vol. 1—Process Technology", 1986, pp. 407-408.

Huemoeller et al., U.S. Appl. No. 10/947,124, filed Sep. 22, 2004, entitled "Method for Making an Integrated Circuit Substrate Having Embedded Back-Side Access Conductors and Vias".

Hiner et al., U.S. Appl. No. 11/098,995, filed Apr. 5, 2005, entitled "Method for Making an Integrated Circuit Substrate Having Laminated Laser-Embedded Circuit Layers".

Huemoeller et al., U.S. Appl. No. 11/543,540, filed Oct. 4, 2006, entitled "Method and Structure for Creating Embedded Metal Features".

Rusli et al., U.S. Appl. No. 11/621,402, filed Jan. 9, 2007, entitled "Embedded Circuit Pattern Fabrication Method and Structure".

Huemoeller et al., U.S. Appl. No. 11/903,002, filed Sep. 19, 2007, entitled "Substrate Having Stiffener Fabrication Method".

Huemoeller et al., U.S. Appl. No. 11/982,637, filed Nov. 1, 2007, entitled "Circuit-on-Foil Process for Manufacturing a Laminated Semiconductor Package Substrate Having Embedded Conductive Patterns".

\* cited by examiner

MULTI-LEVEL CIRCUIT SUBSTRATE FABRICATION METHOD

CROSS-REFERENCE TO RELATED APPLICATIONS

The present application is a continuation of U.S. patent application Ser. No. 11/045,402, filed on Jan. 28, 2005, which is a continuation in part of U.S. patent application Ser. No. 10/138,225 filed May 1, 2002, now U.S. Pat. No. 6,930,256, issued Aug. 16, 2005, having at least one common inventor and assigned to the same assignee. The specification of the above-referenced patent is herein incorporated by reference.

FIELD OF THE INVENTION

The present invention relates generally to semiconductor packaging, and more specifically, to a substrate having a printed circuit layer above laser-embedded conductive patterns for providing electrical inter-connection within an integrated circuit package.

BACKGROUND OF THE INVENTION

Semiconductors and other electronic and opto-electronic assemblies are fabricated in groups on a wafer. Known as "dies", the individual devices are cut from the wafer and are then bonded to a carrier. The dies must be mechanically mounted and electrically connected to a circuit. For this purpose, many types of packaging have been developed, including "flip-chip", ball grid array and leaded grid array among other mounting configurations. These configurations typically use a planar printed circuit etched on the substrate with bonding pads and the connections to the die are made by either wire bonding or direct solder connection to the die.

The resolution of the printed circuit is often the limiting factor controlling interconnect density. Photo-etch and other processes for developing a printed circuit on a substrate have resolution limitations and associated cost limitations that set the level of interconnect density at a level that is less than desirable for interfacing to present integrated circuit dies that may have hundreds of external connections.

As the density of circuit traces interfacing an integrated circuit die are increased, the inter-conductor spacing must typically be decreased. However, reducing inter-conductor spacing has a disadvantage that migration and shorting may occur more frequently, thus setting another practical limit on the interconnect density.

The above-incorporated parent patent application discloses techniques for embedding circuit patterns within a substrate for providing such high-density interconnection. One penalty that is paid for fully-embedded circuits such as those disclosed therein, is that large circuit areas require more laser-ablate time at the same line width and more careful control of the laser when producing large areas via multiple scans. Embedded terminals also sometimes must be plated up to provide a particular thickness above the substrate especially when the terminal is to project into a solder mask layer applied above the embedded circuits. It would be desirable to provide a method and substrate having further improved interconnect density with a low associated manufacturing cost, and further having easily generated large features above the surface of the substrate without requiring ablation of large areas or a second plate-up process.

SUMMARY OF THE INVENTION

A substrate including a printed circuit layer having levels atop and within a dielectric and a method for manufacturing a substrate provide increased circuit density and design flexibility for semiconductor packaging. A surface of a dielectric layer is laser-ablated to produce channels outlining a desired channel circuit pattern and conductive material is then plated over the surface of the dielectric layer and into the channels. A pattern is imaged on the plated conductive material for simultaneously removing material above the channels and forming a circuit pattern above the substrate surface, yielding a two-layer homogeneous metal structure forming a conductive pattern having features beneath the surface and features atop the surface. The opposing surface of the substrate may be simultaneously prepared in the same manner, yielding a four-level substrate. The pattern above the substrate surface may include terminal lands only, or it may include an interconnect pattern, vias and other features as well. The process may also be extended to include further layers generated on laminated dielectric layers to create a sandwich structure for multi-layer circuit applications.

BRIEF DESCRIPTION OF THE DRAWINGS

The invention, as well as a preferred mode of use and advantages thereof, will best be understood by reference to the following detailed description of illustrative embodiments when read in conjunction with the accompanying drawings, wherein like reference numerals indicate like parts throughout.

DETAILED DESCRIPTION

The above-incorporated parent patent application discloses a process and structure for manufacturing a low-cost substrate having high conductor density and electrical integrity by embedding the conductive patterns beneath the surface of a substrate. The substrate is a laser-ablated substrate that does not require custom tooling for producing channels for conductors within a substrate and provides a manufacturing process having low cost and high conductor density.

The present invention provides an even higher-density routing capability by generating another etched level atop the dielectric surface(s) where the embedded conductors are located. The resulting metal circuit is a homogeneous metal structure having features atop the dielectric surface and features within the dielectric. The printed layer can contain large features that are generally time consuming to generate within channels and also in general are desirably located above or conformal with the substrate surface. Examples of such large features are: grid array lands, wire-bond pads and power distribution patterns. In contrast, the channel level conductors can include very fine-pitched interconnects due to the isolation provided between the channels and the increased depth of the conductors. One resulting effect is that die sizes can be substantially reduced by providing a finer wire-bond pad pitch and denser routing capability.

Figure 1A:
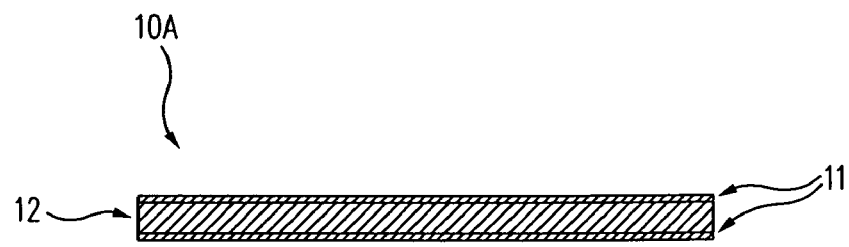
FIGS. 1A-1K are a pictorial diagrams depicting cross sectional side views illustrating steps of making a substrate in accordance with an embodiment of the invention.
Figure 1B:

Referring now to the figures and in particular to FIG. 1A, a side view of a clad dielectric 10A, composed of a dielectric layer 12 covered by cladding 11 on both sides for use in preparing a substrate in accordance with an embodiment of the present invention, is depicted. Clad dielectric 10A is the first stage of preparation of the illustrated substrate, and is processed with etchant to provide the second stage of substrate 10B, which is dielectric layer 12 without the cladding. However, alternatives include providing a dielectric film without cladding or other solid dielectric layer that can be processed in the steps illustrated subsequent to that of FIG. 1B.

Figure 1C:
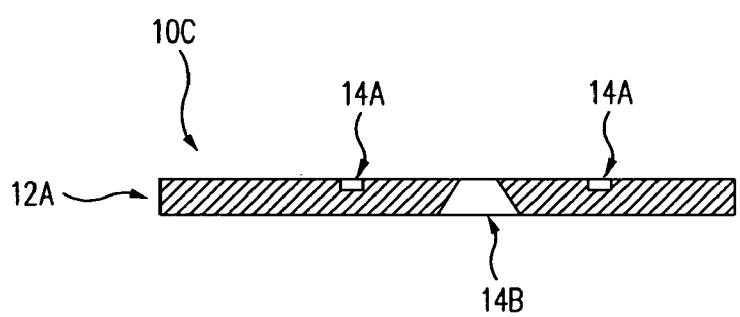
Figure 1D:
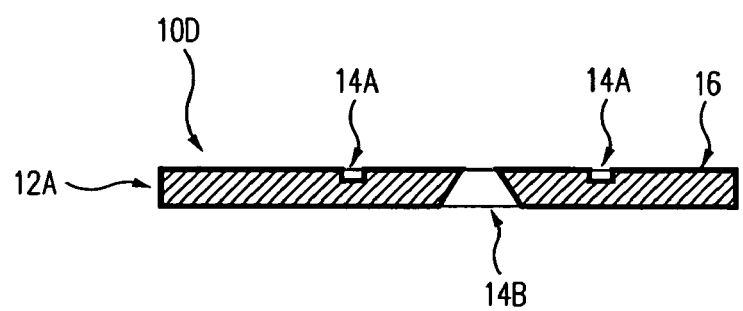
Figure 1E:
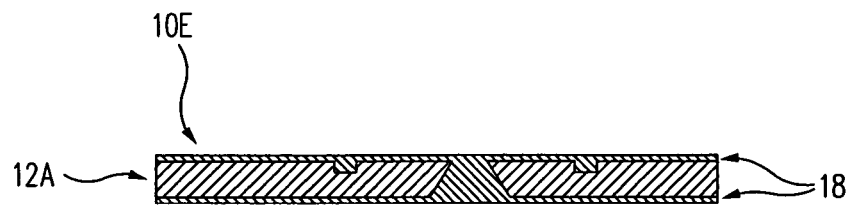

A controlled laser is used to produce features within and through substrate 10B to produce substrate 10C of FIG. 1C that includes via holes 14B and channels 14A in an ablated dielectric layer 12A. Next, as illustrated in FIG. 1D, an electro-less seed plating layer 16 is generated on all surfaces of dielectric layer 12A forming substrate 10D. Next, as shown in FIG. 1E, electroplating is performed to generate metal circuit 18, which is a homogeneous metal plated structure that fills channels 14A, vias 14B and covers the surface(s) of substrate 10E.

Figure 1F:
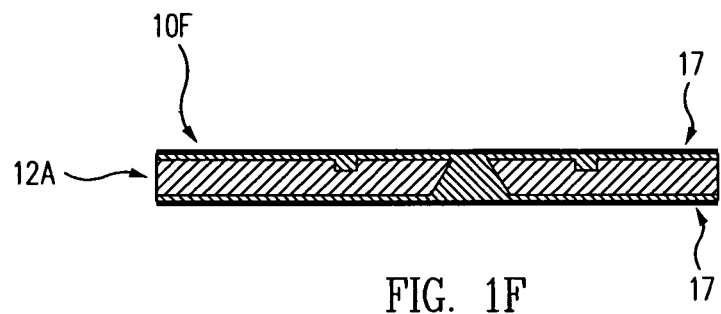
Figure 1G:
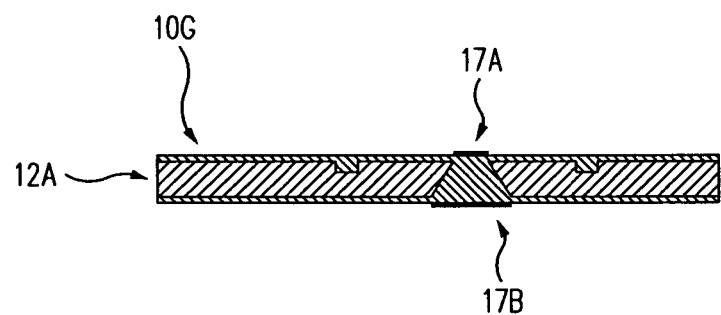
Figure 1H:
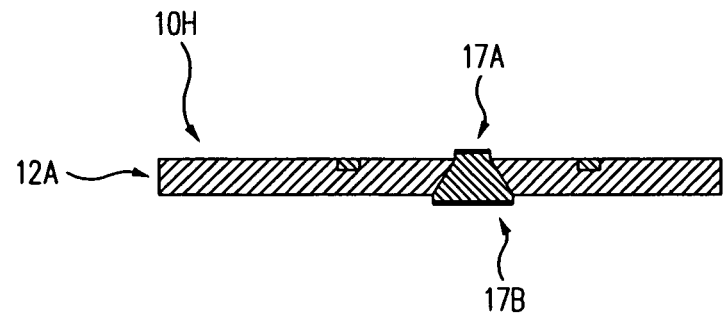
Figure 1I:
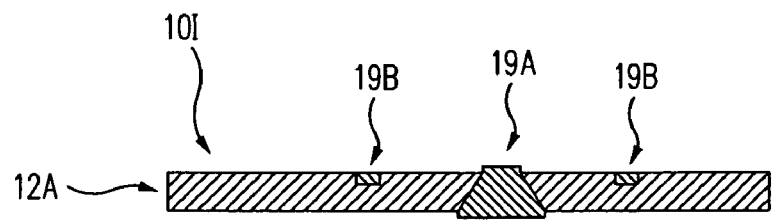

After substrate 10E is completely covered in metal of sufficient height to generate all above-surface features, a photoresist film 17 is applied to the plated metal forming substrate step 10F as illustrated in FIG. 1F. Then, the photoresist is exposed and removed except in the above-surface feature areas 17A and 17B generating substrate 10G as illustrated in FIG. 1G. Next, the substrate 10G is etched to form substrate 10H, which now includes the metal circuit above and within the dielectric 12A, with film remaining in feature areas 17A and 17B. Finally, the remaining film is removed, yielding substrate 10I in accordance with an embodiment of the invention. Substrate 10I is illustrated as including a via 19A, and laser-embedded conductive pathways 19A and 19B. However, FIG. 11 is intended to be illustrative of a potential final step in the process and not an actual substrate, which will have hundreds of features and conductive pathways and will include regions where the metal circuit extends within the substrate and also atop the substrate, providing a two-level circuit that homogeneously bridges the two levels to provide an interconnection. Such features are distinguishable from metal applied in separate steps, as is well known in the art of metallurgy, as microscopic crystalline differences will exist for a metal circuit plated up in a continuous manner rather than being deposited in subsequent plating processes. A single layer of metal generally will also provide a more reliable, lower resistance pathway than one produced in multiple steps.

Figure 1J:
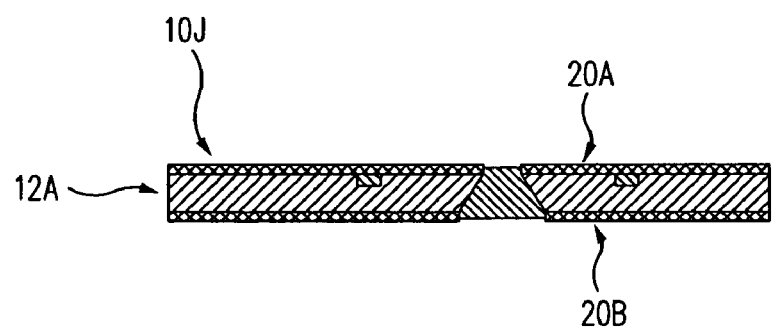
Figure 1K:
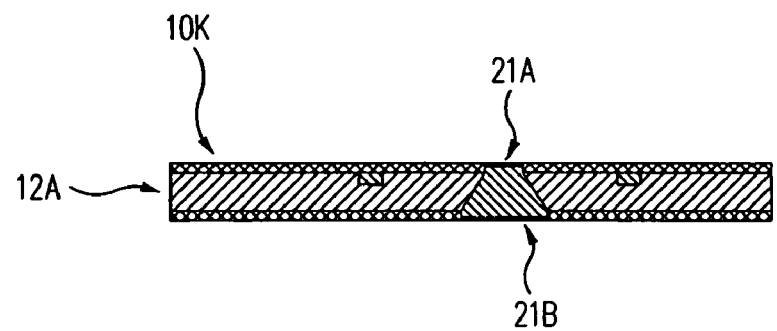

Referring now to FIG. 1J, solder mask 20A and 20B may be applied to the surfaces of substrate 10I to protect channel conductors 19B and facilitate attachment of solder balls and other features by providing surfaces that will not permit wicking and adhesion to covered areas. The regions where terminals will be formed on via 19A (and other terminals not shown) are either laser-ablated or imaged open via a photosensitive solder mask process to form substrate 10J. Finally, a plating such as OSP or nickel-gold may be applied to form terminals 21A and 21B to facilitate solder or wirebond attach, as well as protect the terminal areas from corrosion forming finished substrate 10K as shown in FIG. 1K.

Figure 2A:
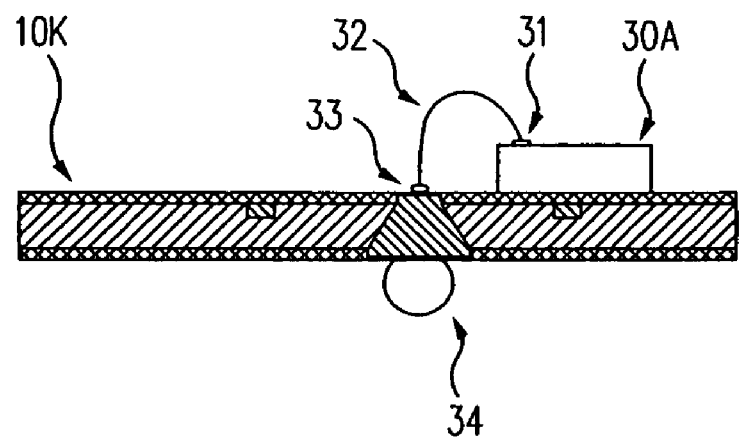
FIG. 2A is a pictorial diagram depicting an integrated circuit in accordance with an embodiment of the invention.

Referring now to FIG. 2A, a semiconductor package formed using substrate 10K is shown. A die 30A is mounted to substrate 10K, generally with an adhesive film or epoxy and wires 32 are bonded between electrical terminals 31 of the die 30A and bond pads 33 on substrate 10K. Solder balls 34 are attached to lands on the bottom side of substrate 10K to form a ball grid array package, which can then be encapsulated on the top side. An alternative semiconductor package is shown in FIG. 2B, where a die 30B is mounted in a flip-chip configuration using solder balls 34A or alternatively solder posts.

Figure 2B:
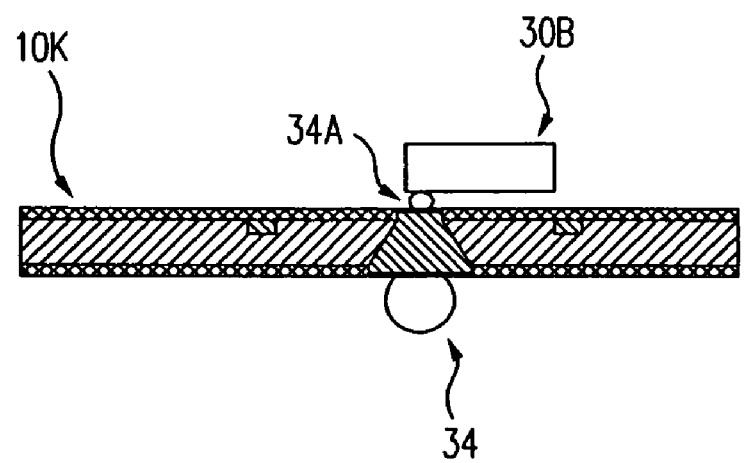
FIG. 2B is a pictorial diagram depicting an integrated circuit in accordance with another embodiment of the invention.

FIGS. 2A and 2B are intended to be illustrative of semiconductor packages (packaged integrated circuits) that may be manufactured in accordance with embodiments of the present invention and are thus not intended to be limiting. The techniques of the present invention have applications to other semiconductor package types and die types, as the two-level homogeneous metal circuit produced by the techniques of the present invention provides higher interconnect density in a low-cost manufacturing process.

Figure 3A:
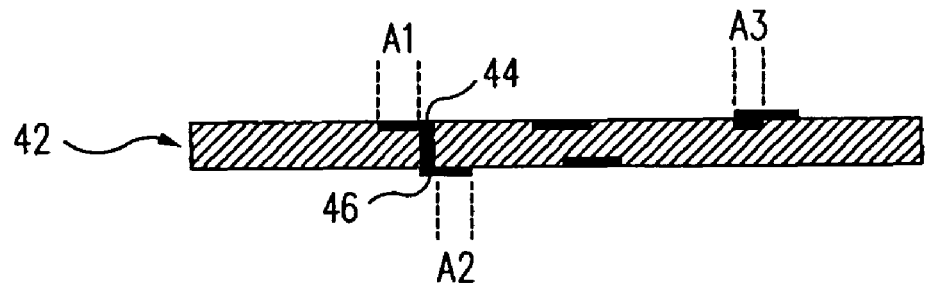
FIG. 3A is a pictorial diagram depicting a substrate in accordance with another embodiment of the invention.

Referring now to FIG. 3A, a more general representation of the semiconductor package substrate of the present invention is shown. A dielectric layer 42 includes metal circuit channel areas 44 formed within dielectric layer 42 (via laser-ablation, plating and etching) and metal circuit surface areas 46 formed atop dielectric layer 42 (via plating and etching). Area A1 illustrates an area where the metal circuit is channel level only, area A2 illustrates an area where the metal circuit is above-surface level only (in the illustration, actually below the opposite surface) and area A3 illustrates an area where the metal circuit bridges the two levels to provide a conductive path from a channel to a surface feature. All of the illustrations described above are for a double-sided substrate, but a single sided substrate may also be produced by selectively plating a dielectric layer that has been laser ablated on one side.

Figure 3B:
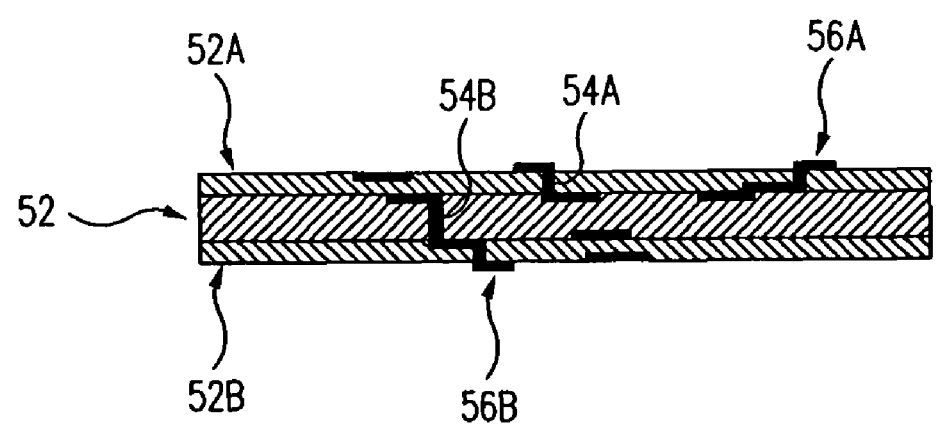
FIG. 3B is a pictorial diagram depicting a substrate in accordance with yet another embodiment of the invention.

FIG. 3B depicts an extension of the present invention to a multi-layer multi-level structure. Additional dielectric layers 52A and 52B may be laminated on a dielectric layer 52 prepared with two-level circuits in accordance with an embodiment of the present invention. Then, additional dielectric layers 52A and 52B may be subjected to the above-described process to generate two more outer two-level layers 56A and 56B having channels and surface-located features. Connections between circuit layers are provide by vias 54A such as those vias 54B used to connect the two-level structures on opposite sides of original dielectric layer 52.

While the figures illustrate conductive circuit channels and above surface features, the figures are depicting only a portion of the total substrate. Hundreds of circuit channels and terminals will generally be used in an integrated circuit design and may be oriented in any direction within the surface of the substrate. Similarly, the pattern above the substrate surface may include terminal lands only, or may include circuit patterns as well. However, the pattern atop the substrate should be designed so that channel conductors are appropriately isolated when the metal is removed, and so unless two channels are to be electrically bridged, the pattern level above the substrate does not cross both of those channels, as electrical contact is made between a channel and the level above the substrate when any metal is present at both levels (i.e., when the circuit-positive photomask for the top layer intersects the channel ablating pattern at any point in the two-dimensional plane of the substrate surface).

The above description of embodiments of the invention is intended to be illustrative and not limiting. Other embodiments of this invention will be obvious to those skilled in the art in view of the above disclosure and fall within the scope of the present invention.

What is claimed is:
1. A method comprising:
   laser-ablating features within a dielectric layer, the dielectric layer comprising a top plane defining a top surface of the dielectric layer, wherein the features are formed in the top surface of the dielectric layer;

forming a metal plated structure that fills the features and covers the top surface of the dielectric layer; and etching the metal plated structure to form a top two-level metal circuit, wherein a first portion of the top two-level metal circuit is below the top plane, a second portion of the top two-level metal circuit is above the top plane, and a third portion of the top two-level metal circuit extends from below the top plane to above the top plane.

2. The method of claim 1 wherein the features comprise channels in the top surface of the dielectric layer.

3. The method of claim 2 wherein the channels extend only partially into the dielectric layer.

4. The method of claim 1 wherein the features comprise via holes through the dielectric layer.

5. The method of claim 4 wherein the forming a metal plated structure that fills the features and covers the top surface of the dielectric layer comprises filling the via holes to form conductive vias through the dielectric layer.

6. The method of claim 1 wherein the dielectric layer further comprises a bottom plane defining a bottom surface of the dielectric layer, wherein the laser-ablating features comprises forming the features in the bottom surface of the dielectric layer.

7. The method of claim 6 wherein the forming a metal plated structure that fills the features and covers the top surface of the dielectric layer comprises covering the bottom surface of the dielectric layer with the metal plated structure.

8. The method of claim 7 wherein the etching the metal plated structure to form a top two-level metal circuit comprises forming a bottom two-level metal circuit, wherein a first portion of the bottom two-level metal circuit is below the bottom plane, a second portion of the bottom two-level metal circuit is above the bottom plane, and a third portion of the bottom two-level metal circuit extends from below the bottom plane to above the bottom plane.

9. The method of claim 8 wherein the features comprise via holes through the dielectric layer, wherein the forming a metal plated structure that fills the features and covers the top surface of the dielectric layer comprises filling the via holes to form conductive vias through the dielectric layer, the conductive vias coupling the top two-level metal circuit to the bottom two-level metal circuit.

10. The method of claim 1 further comprising forming a seed layer on the dielectric layer prior to formation of the metal plated structure.

11. The method of claim 1 wherein
the dielectric layer is a first dielectric layer, the method further comprising:
laminating a second dielectric layer to the top surface of the first dielectric layer;
laser-ablating features within the second dielectric layer, the second dielectric layer comprising a top plane defining a top surface of the second dielectric layer, wherein the features are formed in the top surface of the second dielectric layer;
forming a second metal plated structure that fills the features within the second dielectric layer and covers the top surface of the second dielectric layer; and
etching the second metal plated structure to form a second two-level metal circuit, wherein a first portion of the second two-level metal circuit is below the top plane of the second dielectric layer, a second portion of the second two-level metal circuit is above the top plane of the second dielectric layer, and a third portion of the second two-level metal circuit extends from below the top plane of the second dielectric layer to above the top plane of the second dielectric layer.

12. The method of claim 1 wherein the features comprise top channels having sides extending to the top plane and a bottom beneath the top plane, and
wherein the two-level metal circuit does not extend above the top plane in a first group of areas and wherein the two-level metal circuit does not extend below the top plane in a second group of areas, and wherein the two-level metal circuit extends above and below the top plane in a third group of areas.

13. The method of claim 12, wherein the first group of areas comprises a conductive interconnect pattern for providing interconnection between terminals within a semiconductor package, and wherein the second group of areas comprises a pattern for providing the terminals.

14. The method of claim 13, wherein the terminals include internal wire-bond lands.

15. The method of claim 13, wherein the terminals include external solder ball lands.

16. The method of claim 12, further comprising forming via holes extending through the dielectric layer and wherein the two-level metal circuit extends through the via holes to provide connection of the two-level metal circuit at a bottom surface of the dielectric layer.

17. The method of claim 16, further comprising laser-ablating bottom channels, the bottom channels having bottom channel sides extending to a bottom plane defining the bottom surface of the dielectric layer and bottom channel tops above the bottom plane, and wherein the two-level metal circuit further extends within the bottom channels, providing a bottom interconnect pattern on the bottom surface of the dielectric layer.

18. The method of claim 16, wherein the two-level metal circuit further extends below the bottom surface of the dielectric layer and thereby provides a second bottom level at the bottom surface of the dielectric layer.

19. The method of claim 12, further comprising:
laminating a second dielectric layer to the top surface of the dielectric layer;
laser-ablating channels within the second dielectric layer for forming an embedded second metal circuit at a top plane defining a top surface of the second dielectric layer; and
forming a second homogeneous plated and etched metal circuit having circuit material within the laser-ablated channels.

20. The method of claim 19, wherein the second metal circuit extends above the top surface of the second dielectric layer, and wherein the second metal circuit does not extend above the top plane of the second dielectric layer in a fourth group of areas, wherein the second metal circuit does not extend below the top plane of the second dielectric layer in a fifth group of areas, and wherein the second metal circuit extends above and below the top plane of the second dielectric layer in a sixth group of areas.

* * * * *